United States Patent
Kanarek

(10) Patent No.: US 12,176,968 B1
(45) Date of Patent: Dec. 24, 2024

(54) DEVICE, SYSTEM, AND METHOD FOR INTERFACING WITH A CINEMATOGRAPHY BATTERY PACK

(71) Applicant: Core SWX, LLC, Plainview, NY (US)

(72) Inventor: Ross Kanarek, Plainview, NY (US)

(73) Assignee: Core SWX, LLC, Plainview, NY (US)

( * ) Notice: Subject to any disclaimer, the term of this patent is extended or adjusted under 35 U.S.C. 154(b) by 0 days.

(21) Appl. No.: 18/586,806

(22) Filed: Feb. 26, 2024

(51) Int. Cl.
 *H04B 5/77* (2024.01)
 *G01R 31/382* (2019.01)
 *H01M 10/48* (2006.01)
 *H04B 5/22* (2024.01)
 *H01M 10/42* (2006.01)

(52) U.S. Cl.
 CPC .......... *H04B 5/77* (2024.01); *G01R 31/382* (2019.01); *H01M 10/48* (2013.01); *H04B 5/22* (2024.01); *H01M 2010/4271* (2013.01); *H01M 2010/4278* (2013.01)

(58) Field of Classification Search
 CPC .......... H04B 5/77; H04B 5/22; G01R 31/382; H01M 10/48; H01M 2010/4271; H01M 2010/4278
 USPC ....................................... 455/41.1
 See application file for complete search history.

(56) References Cited

U.S. PATENT DOCUMENTS

| | | | |
|---|---|---|---|
| 9,026,187 B2 * | 5/2015 | Huang | H04B 1/3888 455/575.8 |
| 10,197,630 B2 | 2/2019 | Kanarek | |
| 10,630,095 B1 | 4/2020 | Kanarek | |
| 10,841,492 B2 | 11/2020 | Kanarek | |
| 10,921,381 B2 * | 2/2021 | Karner | H01M 10/4257 |
| 10,966,306 B1 * | 3/2021 | Recker | H02J 9/02 |
| 11,368,033 B2 * | 6/2022 | Baarman | H02J 7/005 |
| 11,388,573 B1 * | 7/2022 | Hsu | H04W 4/80 |
| 11,735,841 B1 | 8/2023 | Kanarek | |
| 11,770,012 B1 | 9/2023 | Kanarek | |
| 11,936,413 B1 * | 3/2024 | Zalewski | H02N 11/002 |
| 2016/0299194 A1 * | 10/2016 | Kanarek | H01M 10/4257 |
| 2018/0007634 A1 * | 1/2018 | Pereira | H04W 52/0264 |
| 2018/0081417 A1 * | 3/2018 | Chan | G06F 1/3212 |
| 2019/0392281 A1 * | 12/2019 | Chen | G06K 19/0772 |
| 2020/0296283 A9 * | 9/2020 | Kanarek | H04N 23/663 |
| 2023/0051999 A1 * | 2/2023 | Noller | H02J 7/007188 |

* cited by examiner

*Primary Examiner* — Mong-Thuy T Tran
(74) *Attorney, Agent, or Firm* — Shore IP Group, PLLC; Sean R. Wilsusen

(57) ABSTRACT

A system for interfacing with a cinematography battery pack includes a proximity tag module configured to control the function(s) of the cinematography battery pack. A NFC/RFID chip is configured to transmit data for the cinematography battery pack. The NFC/RFID chip is configured to receive instructions to control the function(s) of the cinematography battery pack. A microcontroller (MCU) is in communication with the NFC/RFID chip. The MCU is configured to provide the data for the cinematography battery pack to the NFC/RFID chip. The MCU is configured to receive the instructions to control the function(s) of the cinematography battery pack from the NFC/RFID chip. A proximity tag read/write device includes a control module configured to receive the data for the cinematography battery pack from the NFC/RFID chip. The control module is configured to transmit the instructions to the NFC/RFID chip to control the function(s) of the cinematography battery pack.

20 Claims, 10 Drawing Sheets

DEVICE, SYSTEM, AND METHOD FOR INTERFACING WITH A CINEMATOGRAPHY BATTERY PACK

FIELD

The present disclosure relates to a cinematography battery pack and, more particularly, to a device, system, and method for interfacing with a cinematography battery pack.

BACKGROUND

In the fast-paced world of cinematic production, efficiency and reliability are paramount. Traditional methods of monitoring battery information often involve cumbersome equipment, such as charging stations or installed Wi-Fi chips within the battery pack. These methods not only complicate workflows but also consume valuable resources like space, time, and power.

Moreover, in busy work environments, wireless signals are often compromised due to bandwidth constraints, especially in scenarios where wireless video and audio transmission is active. This congestion can lead to interference and reliability issues, further complicating the challenges associated with traditional battery management methods.

SUMMARY

The present disclosure describes a dual-interface NFC/RFID chip to streamline cinematography battery pack management. The use of the NFC/RFID chips described herein reduces the power draw of conventional Wi-Fi circuits, and also reduces the size of wireless communication assemblies.

Provided in accordance with aspects of the present disclosure is a system for interfacing with a battery pack. The system includes a cinematography battery pack including a proximity tag module. The proximity tag module is configured to control at least one function of the cinematography battery pack. The cinematography battery pack includes a near field communication/radio frequency identification (NFC/RFID) chip. The NFC/RFID chip is configured to transmit data for the cinematography battery pack. The NFC/RFID chip is configured to receive instructions to control the function(s) of the cinematography battery pack. A microcontroller (MCU) is in communication with the NFC/RFID chip. The MCU is configured to provide the data for the cinematography battery pack to the NFC/RFID chip. The MCU is configured to receive the instructions to control the function(s) of the cinematography battery pack from the NFC/RFID chip. A proximity tag read/write device includes a control module configured to receive the data for the cinematography battery pack from the NFC/RFID chip. The control module is configured to transmit the instructions to the NFC/RFID chip to control the function(s) of the cinematography battery pack.

In an aspect of the present disclosure, the control module of the proximity tag read/write device includes a processor and a memory in communication with the processor. The memory stores computer instructions configured to instruct the processor to cause the control module to transmit the instructions to the NFC/RFID chip to control function(s) of the cinematography battery pack.

In an aspect of the present disclosure, a system management bus (SMBus) library is configured to provide a communication protocol between the MCU and the NFC/RFID chip. The SMBus library includes a number of communication fields.

In an aspect of the present disclosure, the MCU is configured to select at least one communication field from the SMBus library to provide the data for the cinematography battery pack to the NFC/RFID chip.

In an aspect of the present disclosure, the proximity tag read/write device is a smartphone, tablet computer, laptop computer, a near field communication scanner, or a special purpose near field communication read/write device.

In an aspect of the present disclosure, the data for the cinematography battery pack includes at least one of a battery name, a cycle count, a manufacturing date, a voltage, a design capacity, a current charge capacity, a firmware revision, an asset tag, a serial number, a current, a current percentage charge, a battery chemistry, a battery production deal, or a battery health.

In an aspect of the present disclosure, the control module is configured to transmit the instructions to the NFC/RFID chip to control at least one of asset tag information, an entered date of first use, or a display color of at least one light of the cinematography battery pack.

In an aspect of the present disclosure, the memory of the control module stores computer instructions configured to instruct the processor to cause the control module to detect an asset tag of the cinematography battery pack or to assign a new asset tag to the cinematography battery pack.

In an aspect of the present disclosure, the memory of the control module stores computer instructions configured to instruct the processor to cause the control module to compile a list of managed cinematography battery packs. The compiled list of managed cinematography battery packs includes the cinematography battery pack controlled by the proximity tag module.

In an aspect of the present disclosure, the computer instructions are further configured to instruct the processor to add an additional cinematography battery pack to the compiled list of managed cinematography battery packs.

In an aspect of the present disclosure, the computer instructions are further configured to instruct the processor to remove at least one cinematography battery pack from the compiled list of managed cinematography battery packs.

In an aspect of the present disclosure, the memory of the control module stores computer instructions configured to instruct the processor to cause the control module to select at least one color for a light emitting diode display of the cinematography battery pack.

Provided in accordance with aspects of the present disclosure is a cinematography battery pack includes a proximity tag module configured to control at least one function of the cinematography battery pack. The cinematography battery pack includes the FC/RFID chip and the MCU. The NFC/RFID chip is configured to receive write instructions from a proximity tag read/write device including a control module configured to transmit the instructions to the NFC/RFID chip to control the function(s) of the cinematography battery pack.

BRIEF DESCRIPTION OF THE DRAWINGS

Various aspects and features of the present disclosure are described hereinbelow with reference to the drawings wherein.

DETAILED DESCRIPTION

Figure 1:
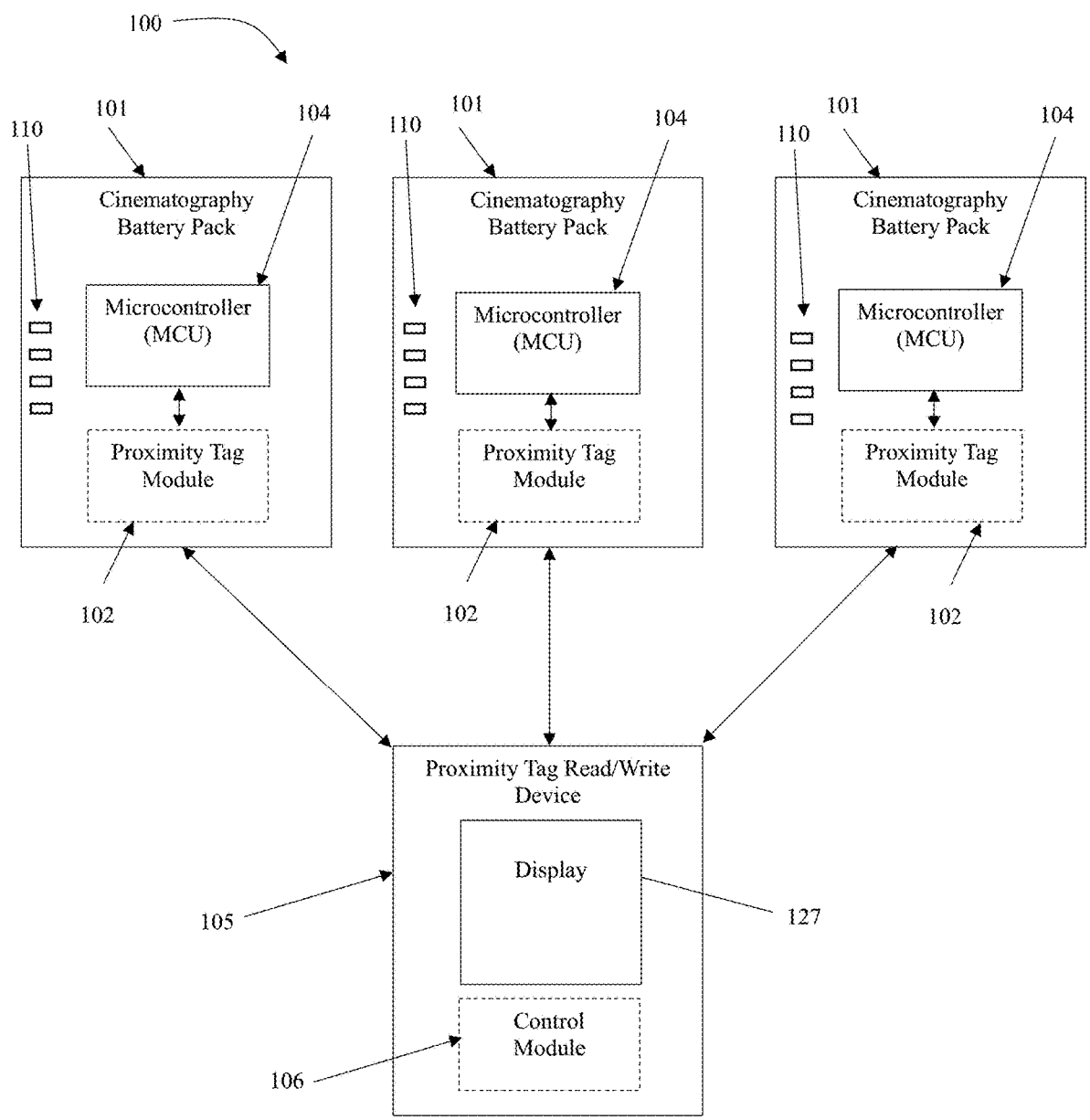
FIG. 1 is a schematic diagram of a system for interfacing with a cinematography battery pack according to aspects of the present disclosure.

Descriptions of technical features or aspects of an exemplary configuration of the disclosure should typically be considered as available and applicable to other similar features or aspects in another exemplary configuration of the disclosure. Accordingly, technical features described herein according to one exemplary configuration of the disclosure may be applicable to other exemplary configurations of the disclosure, and thus duplicative descriptions may be omitted herein.

Exemplary configurations of the disclosure will be described more fully below (e.g., with reference to the accompanying drawings). Like reference numerals may refer to like elements throughout the specification and drawings.

The phrases "battery mount," "mount plate," and "battery mount plate" may be used interchangeably herein. The phrases "battery," "battery pack," "cinematography battery," "cinematography battery pack," and "pack" may be used interchangeably herein.

The present inventive concept utilizes the portability and size of NFC technology to enable filmmakers to effortlessly access battery information. With just a simple tap of a read/write device (e.g., a smartphone), users can perform read/write operations, eliminating the requirement for additional equipment. This capability facilitates the retrieval of comprehensive battery data, empowering users to make informed decisions on the spot. As a result, the reliance on bulky charging stations or cumbersome equipment is eliminated.

According to aspects of the present disclosure, a dual-interface RFID/NFC-based system of battery management in the cinematic industry is described, which seamlessly integrates Radio Frequency Identification (RFID) and Near Field Communication (NFC) technology into battery packs (see, e.g., cinematography battery pack(s) 101 in FIG. 1). The NFC/RFID chip (see, e.g., NFC/RFID chip 103 in FIG. 2), which may be discreetly placed behind a label or within the shell casing of a battery pack, establishes a wireless communication link with read/write devices (e.g., smartphones) or RFID/NFC-enabled readers, providing instant access to critical battery vitals and the ability to control the various features of the battery pack in a single read/write device (see, e.g., proximity tag read/write device 105 in FIG. 1).

Connected to the battery pack's Microcontroller Unit (MCU), the NFC/RFID chip facilitates efficient data exchange, offering access to essential battery information in the MCU's memory while also offering a write function to alter select information as well as features. The read details may include battery name, cycle count, manufacturing date, voltage, design capacity, current charge capacity, firmware revision, etc. The write details may include asset tag information, entered date of first use, LED color change, etc.

According to an aspect of the present inventive concept, to organize and communicate this data effectively, fields within a SMBus library may be utilized. Additionally, custom fields can be added to the library to handle unique data exchanges, as desired.

The integration of the SMBus library enhances communication protocols, providing functions and data structures tailored for SMBus devices. Through the SMBus interface, battery vitals can be seamlessly communicated, enabling real-time monitoring and analysis. This integration optimizes workflow efficiency on cinematic sets, empowering filmmakers to make informed decisions swiftly and effectively.

The NFC/RFID chip embedded in the battery pack consumes minimal power and might only be activated when it detects a nearby reader (e.g., proximity tag read/write device 105 in FIG. 1), when utilized in an NFC scenario or passive RFID scenario, harnessing/harvesting the power from the NFC/RFID reader. When the reader device approaches, the chip within the battery pack becomes active, enabling transmission or reception of data. This on-demand feature ensures the most power efficient communication. By eliminating the continual power draw, the battery pack and system described herein enhances energy efficiency without compromising accessibility or functionality. Furthermore, this approach prevents conflicts with frequencies or bandwidth commonly used by Wi-Fi or Bluetooth signals, as RFID transmissions operate on different bands within the radio spectrum. While Wi-Fi typically operates in the 2.4 GHz and 5 GHz bands, RFID systems utilize frequencies like LF (125 kHz), HF (13.56 MHz), and UHF (860-960 MHz).

For large-scale cinematic productions or cinema equipment rental companies utilizing the battery pack and system described herein, the embedded NFC/RFID chip's dual functionality as a NFC/RFID chip for read-only purposes or for read/write purposes offers significant advantages. That is, while the NFC/RFID chip may have both the capabilities of read and write functions, the write functions of the chip may have limited access, such that unauthorized users are not able to access the write features of the NFC/RFID chip. For example, some user profiles might allow read access only. In these contexts, where a multitude of battery packs are in use, the extended range of RFID simplifies the process of bulk receiving. For some clients with larger, high capacity, "block" or "floor" battery packs, where the battery packs are several thousands of dollars each, an active RFID systems, which utilize powered tags, can offer even greater range and more advanced features such as real-time tracking, making them suitable for scenarios where location data is useful in a large production or warehouse. Even in these large environments, the simultaneous NFC function can be invaluable for users or admins to quickly gather or alter information on multiple battery packs.

For on-board, smaller capacity battery packs (e.g., V/G/B-mount), a passive RFID system incorporated with a NFC system, which relies on the power transmitted from the RFID reader, may be more cost-effective and suitable for shorter-range applications. For inventory receiving, having a bulk lot of these battery packs on a cart, a user can quickly return the battery packs into inventory once the cart passes by a proximity tag read/write device, which may communicate with a software application (see, application 400 in FIG. 4) including an inventory receiving program.

Figure 6:
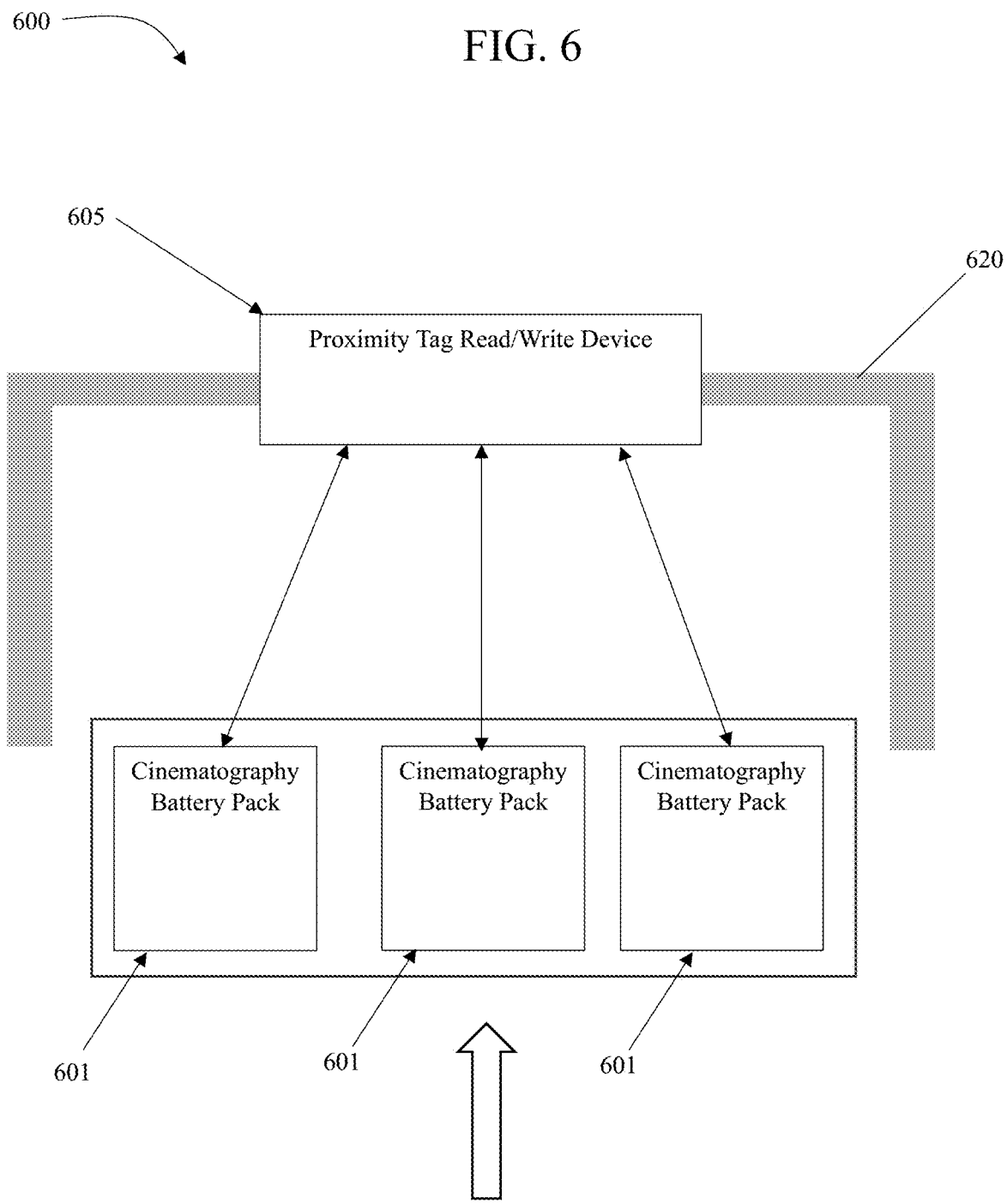
FIG. 6 is a schematic diagram of an assembly for interfacing with multiple battery packs as they pass by a proximity tag read/write device configured for bulk interfacing with numerous battery packs according to aspects of the present disclosure.

Whether active or passive, the NFC/RFID functionality allows for efficient bulk data receiving processes, eliminating the need for individual tapping of each battery with a proximity tag read/write device. For example, FIG. 6 illustrates a proximity tag read/write device arranged to interface with multiple batteries as they are passed by the proximity tag read/write device.

Figure 2:
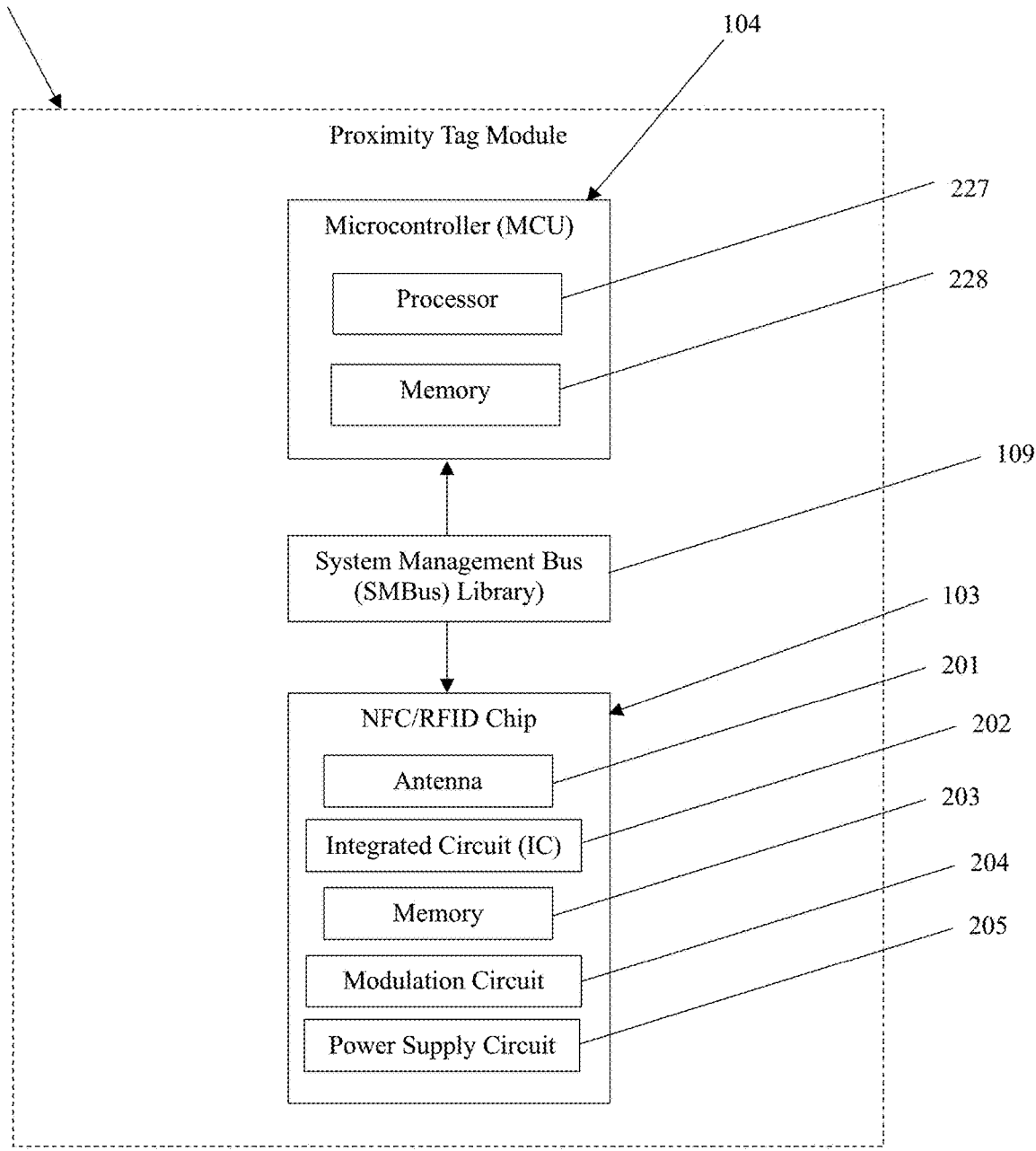
FIG. 2 is an expanded schematic diagram of the proximity tag module of the system of FIG. 1.
Figure 3:
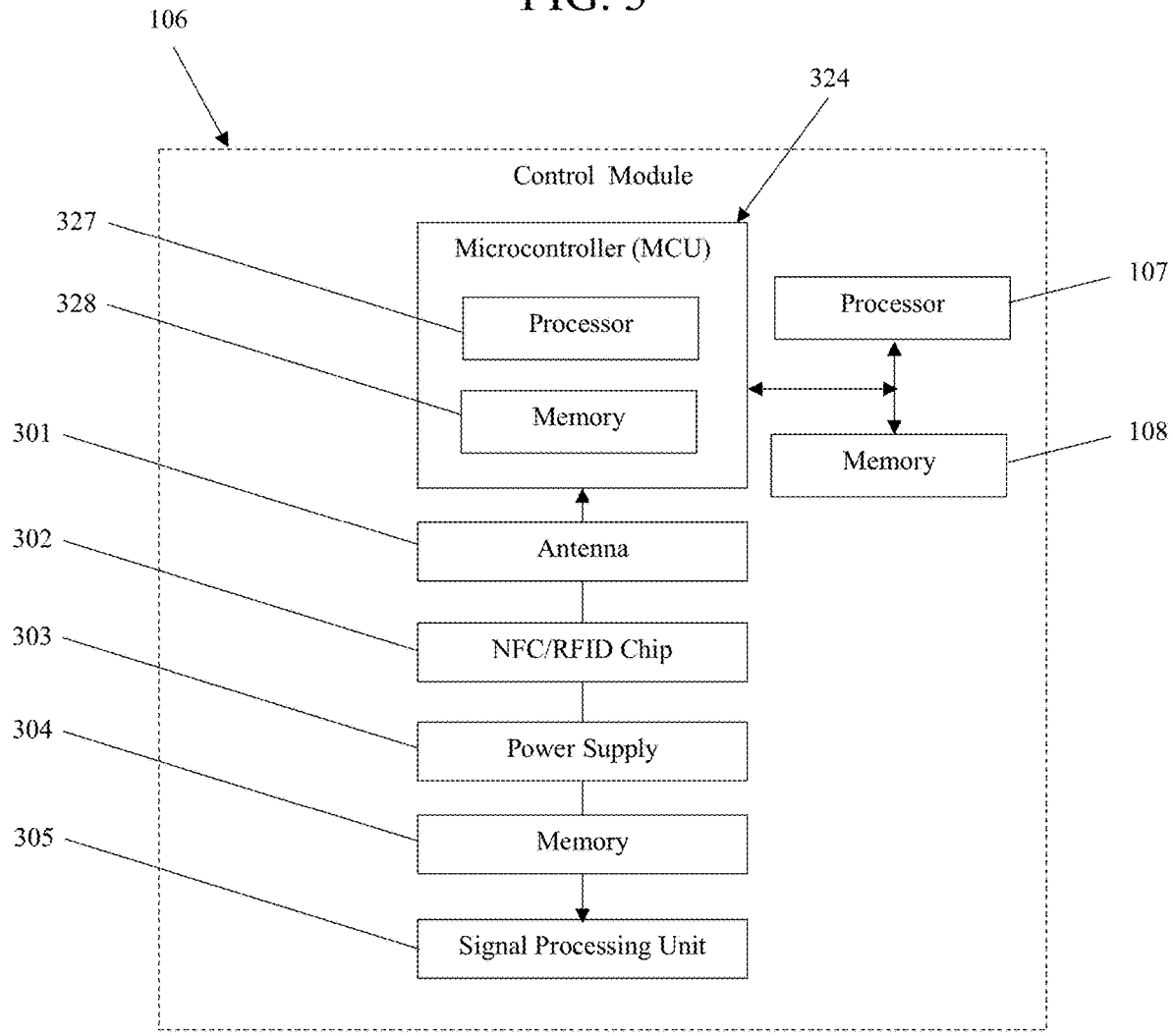
FIG. 3 is an expanded schematic diagram of the control module of the system of FIG. 1.
Figure 4A:
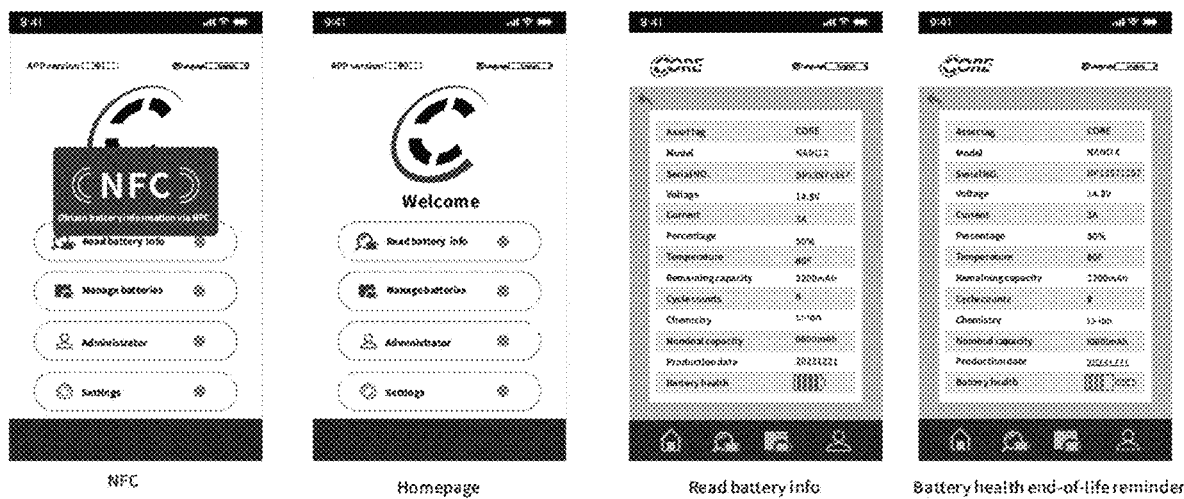
FIGS. 4A to 4J each illustrate screen shots of a software application employable by the system of FIG. 1 for interfacing with a cinematography battery pack.
Figure 4B:
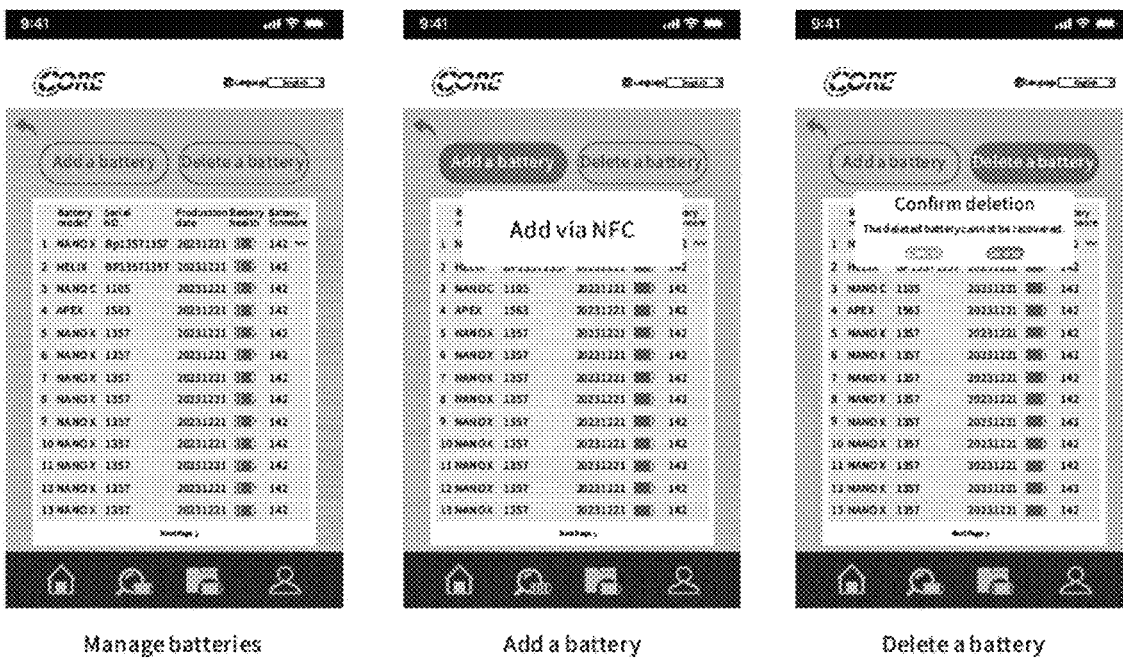
Figure 4C:
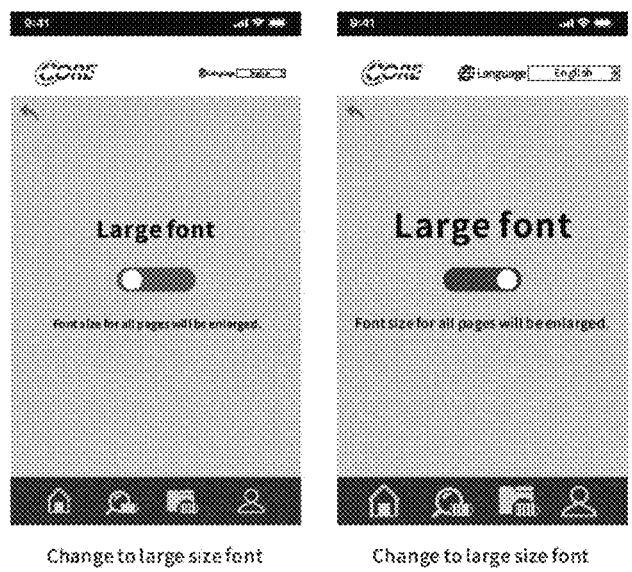
Figure 4D:
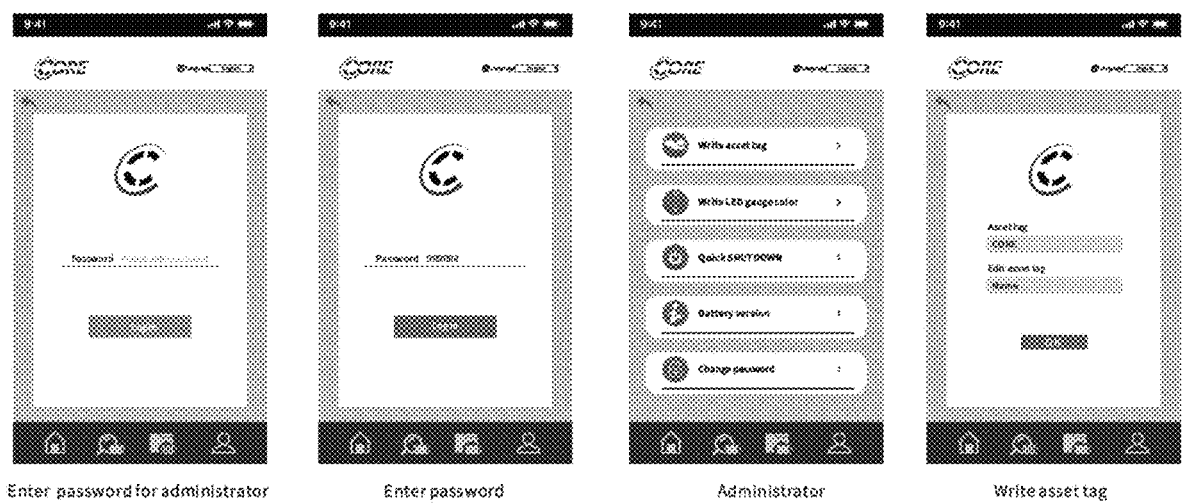
Figure 4E:
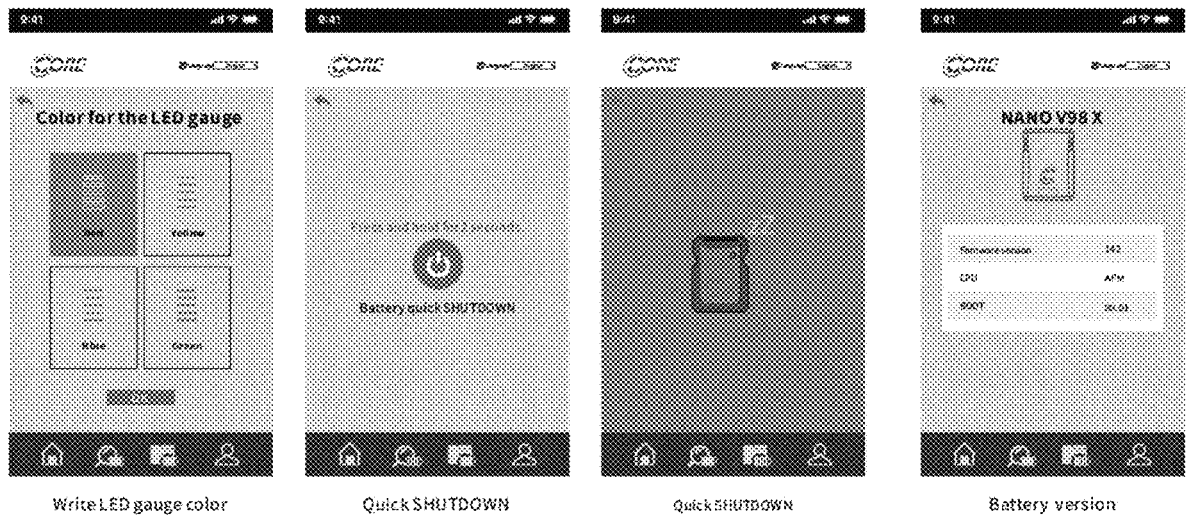
Figure 4F:
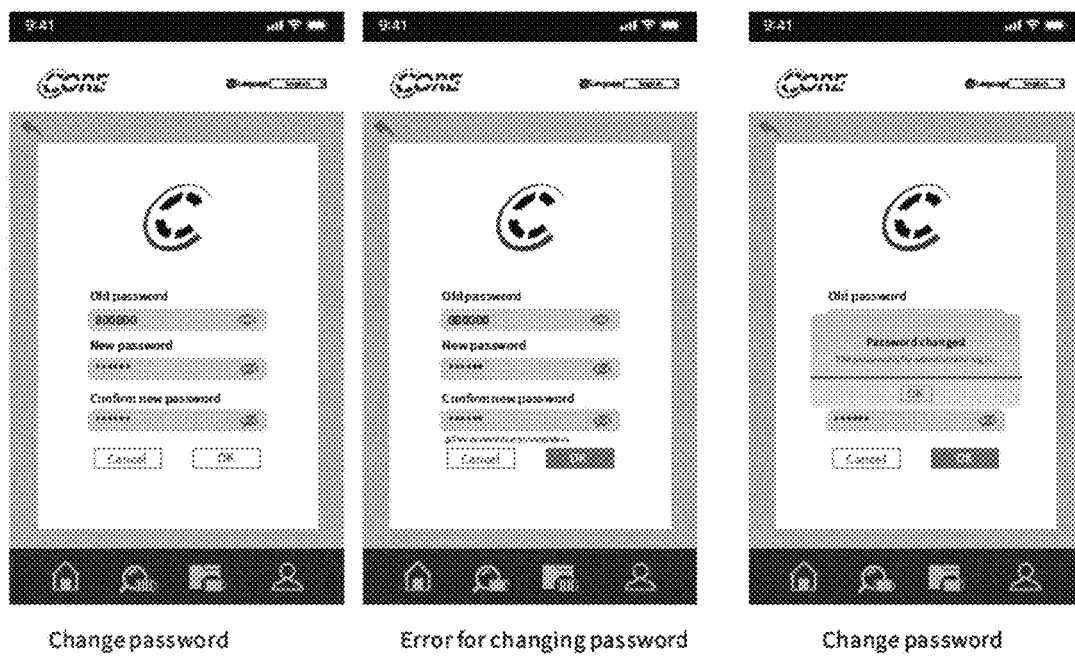
Figure 4G:
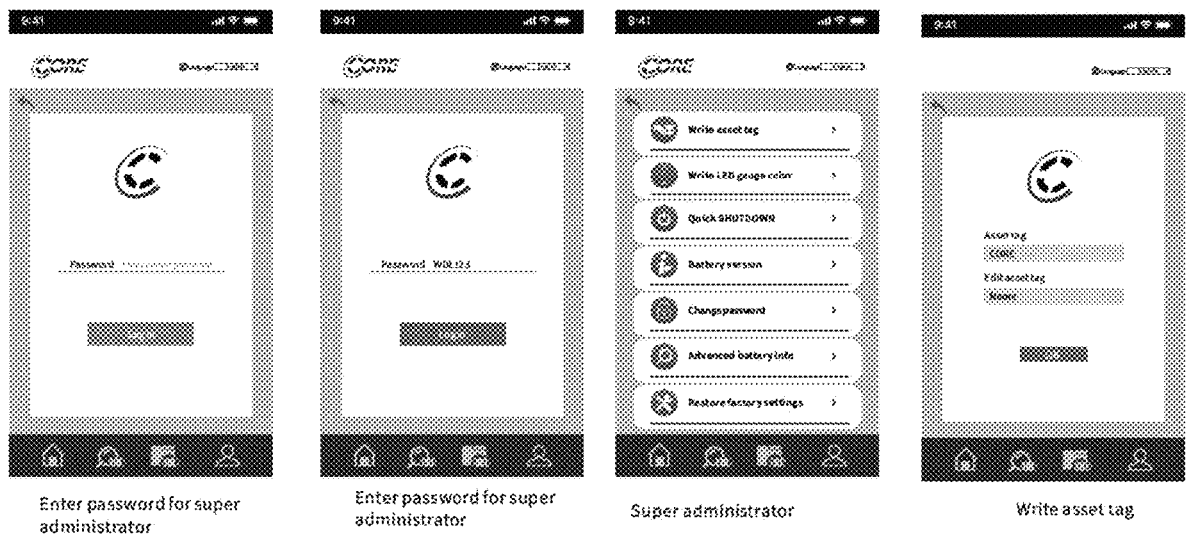
Figure 4H:
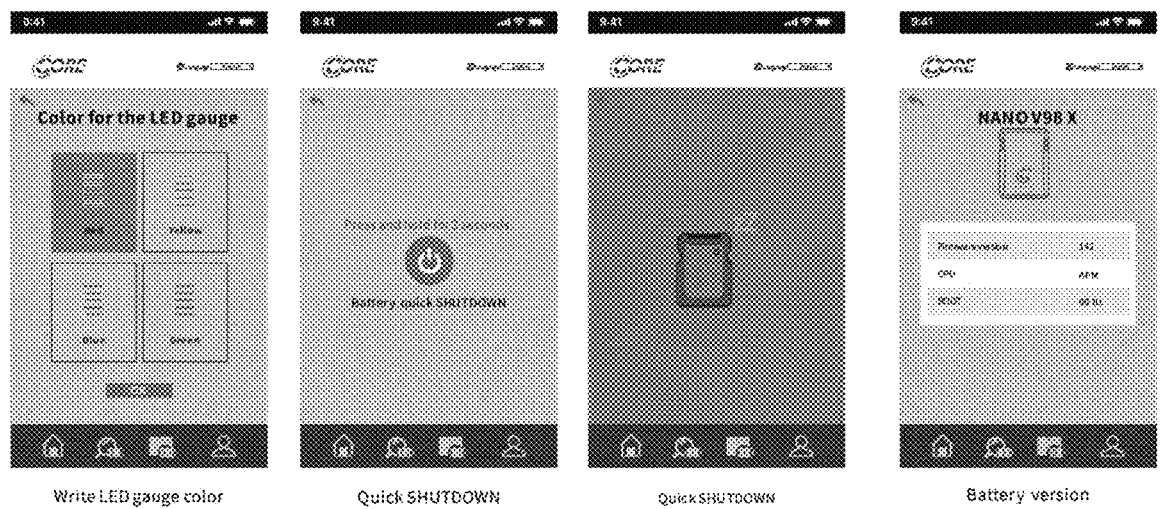
Figure 4I:
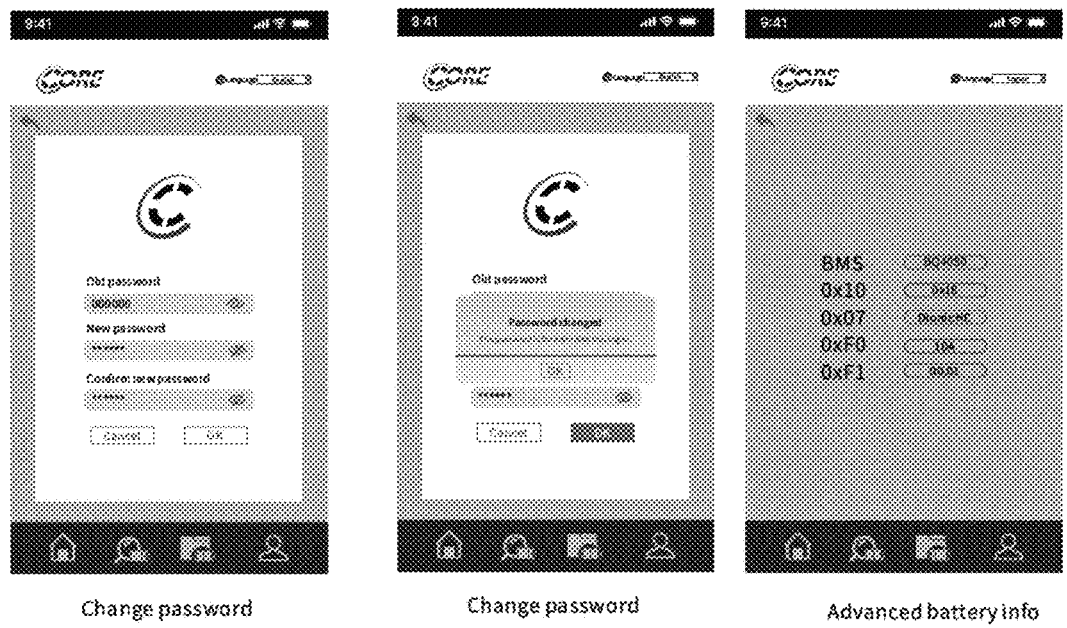
Figure 4J:
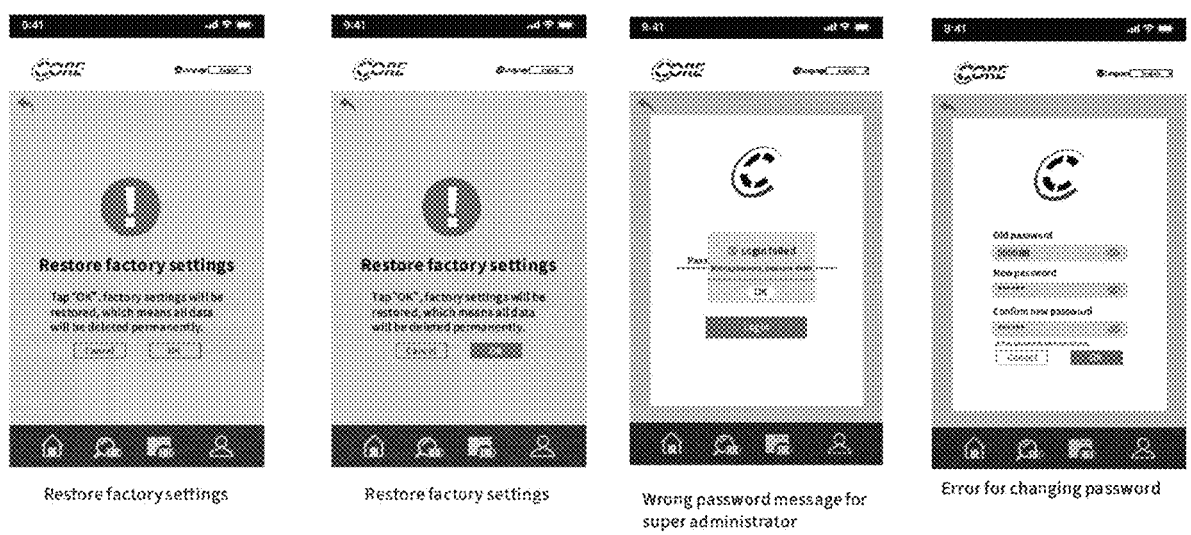

Referring generally to FIGS. 1 to 3, a system 100 for interfacing with a battery pack (e.g., one or more of cinematography battery packs 101) is described. The system 100 includes a cinematography battery pack 101 including a proximity tag module 102. While 3 battery packs are illustrated in FIG. 1, a single battery pack or a larger number of battery packs may be employed in the system 100. The proximity tag module 102 is configured to control at least one function of the cinematography battery pack(s) 101 and to communicate information about the cinematography battery pack(s) 101 in a read/write format. As described in more detail below, the proximity tag module 102 may include or may be in communication with a near field communication/ radio frequency identification (NFC/RFID) chip (see, e.g., NFC/RFID chip 103 in FIG. 2) configured to facilitate the read and write functions described herein.

The cinematography battery pack 101 (e.g., each cinematography battery pack 101 illustrated in FIG. 1) includes the NFC/RFID chip 103. The NFC/RFID chip 103 is configured to transmit data for the cinematography battery pack 101. The NFC/RFID chip 103 is configured to receive instructions to control the function(s) of the cinematography battery pack 101.

A microcontroller (MCU) 104 is in communication with the NFC/RFID chip 103. The MCU 104 is configured to provide the data for the cinematography battery pack 101 to the NFC/RFID chip 103. The MCU 104 is configured to receive the instructions to control the function(s) of the cinematography battery pack 101 from the NFC/RFID chip 103.

A proximity tag read/write device 105 includes a control module 106 configured to receive the data for the cinematography battery pack 101 from the NFC/RFID chip 103. The control module 106 is configured to transmit the instructions to the NFC/RFID chip 103 to control the function(s) of the cinematography battery pack 101.

In an aspect of the present disclosure, the proximity tag read/write device 105 is a smartphone, tablet computer, laptop computer, a near field communication scanner, or a special purpose near field communication read/write device. The proximity tag read/write device 105 (e.g., the control module 106 of the proximity tag read/write device 105) may include any combination of the components of a general purpose computer (see, e.g., general purpose computer 500 described with reference to FIG. 5), such as a display 127. The proximity tag read/write device 105 (e.g., the control module 106 of the proximity tag read/write device 105) may run a software application (see, e.g., software application 400 described in more detail below with reference to FIGS. 4A to 4J).

The control module 106 of the proximity tag read/write device 105 may include a processor 107 and a memory 108 in communication with the processor 107. The memory 108 stores computer instructions configured to instruct the processor 107 to cause the control module 106 to transmit the instructions to the NFC/RFID chip 103 to control function(s) of the cinematography battery pack 101.

As an example, the data for the cinematography battery pack 101 includes at least one of a battery name, a cycle count, a manufacturing date, a voltage, a design capacity, a current charge capacity, a firmware revision, an asset tag, a serial number, a current, a current percentage charge, a battery chemistry, a battery production deal, or a battery health. That is, the battery pack details communicated by the NFC/RFID chip 103 (i.e., a read function) may include any of the preceding items of information.

In an aspect of the present disclosure, the control module 106 is configured to transmit the instructions to the NFC/RFID chip to control at least one of asset tag information, an entered date of first use, or a display color of at least one light of the cinematography battery pack (i.e., write or control functions).

As an example, the memory 108 of the control module 106 stores computer instructions configured to instruct the processor 107 to cause the control module 106 to detect an asset tag of the cinematography battery pack 101 (e.g., a read function) or to assign a new asset tag to the cinematography battery pack 101 (e.g., a write function).

As another example, the memory 108 of the control module 106 stores computer instructions configured to instruct the processor 107 to cause the control module 106 to compile a list of managed cinematography battery packs. The compiled list of managed cinematography battery packs includes the cinematography battery pack 101 controlled by the proximity tag module 102.

In an aspect of the present disclosure, the computer instructions are further configured to instruct the processor 107 to add an additional cinematography battery pack to the compiled list of managed cinematography battery packs.

The computer instructions may further be configured to instruct the processor 107 to remove at least one cinematography battery pack from the compiled list of managed cinematography battery packs.

In an aspect of the present disclosure, the memory 108 of the control module 106 stores computer instructions configured to instruct the processor 107 to cause the control module 106 to select at least one color for a light emitting diode (LED) display (see, e.g., LED array 110 in FIG. 1) of the cinematography battery pack(s) 101. The LED array 110 may be arranged to display a number of colors (e.g., an array of yellow lights, an array of blue lights, an array of red lights, an array of green lights, etc.). The colors may be selected to communicate information about a battery pack (e.g., a number of use cycles the battery pack has gone through).

Referring particularly to FIG. 2, the MCU 104 of the proximity tag module 102 may include a processor 227 and a memory 228. The memory 228 can store modifiable computer instructions configured to instruct the operations of the processor 227. A MCU 104 may refer to a relatively small computer on a single integrated circuit containing a processor core, memory, and programmable input/output peripherals. The MCU 104 may be a component of the cinematography battery pack 101 that communicates with the NFC/RFID chip 103.

In an aspect of the present disclosure, a system management bus (SMBus) library 109 is configured to provide a communication protocol between the MCU 104 and the NFC/RFID chip 103. The SMBus library 109 includes a number of communication fields.

The MCU 104 is configured to select at least one communication field from the SMBus library 109 to provide the data for the cinematography battery pack 101 to the NFC/RFID chip 103.

The NFC/RFID chip 103 may include an antenna 201, an integrated circuit 202, a memory 203, a modulation circuit 204, and a power supply circuit 205.

The antenna 201 is the interface between the chip and the external world. The antenna 201 may receive RF signals from an RFID reader or another NFC-enabled device and convert them into electrical signals that the chip can process. The antenna 201 may also transmit data stored on the chip back to a reader.

The integrated circuit 202 may be configured to modulate and demodulate RF signals, as well as process data. This may include analog front-end circuits for RF signal processing, digital logic for data processing, memory for storing data, and interfaces for communication with external devices.

The memory 203 may be in various forms, such as non-volatile memory (e.g., EEPROM or Flash memory) for storing data that needs to be retained even when power is removed, and volatile memory (e.g., RAM) for temporary data storage during operation.

The modulation circuit 204 may be employed to encode and decode information during communication with external devices, such NFC/RFID readers.

The power supply circuit 205 may regulate the voltage supplied to the chip and optimize power consumption. This may include features such as voltage regulators, power switches, and low-power modes to extend battery life in battery-powered applications.

Referring particularly to FIG. 3, the control module 106 may include any combination of the components of a general purpose computer (see, e.g., computer 500 described in more detail below with reference to FIG. 5). For example, the control module 106 may include the processor 107 and the memory 108.

The control module 106 may employ an MCU 324 including a processor 327 and a memory 328 that is similar to the MCU 104 described in more detail above with reference to FIG. 2.

The control module may include an antenna 301, an NFC/RFID chip 302, a power supply 303, a memory 304, and a signal processing unit 305.

The antenna 301 may be configured to transmit and receive RF signals. For example, the antenna 301 may be configured to emit RF waves to power passive RFID tags or chips and to communicate with such tags or chips.

The NFC/RFID chip 302 is configured to process the signals received from the antenna 301 and can be employed to manage the communication protocol with other NFC/RFID tags (e.g., NFC/RFID chip 103). The NFC/RFID chip 302 may include analog front-end circuitry, digital signal processing, and various interfaces for connecting to a host device.

The power supply 303 may be any of batteries, a USB power supply, or an external power adapters and/or cables.

The memory 304 may be in various forms, such as non-volatile memory (e.g., EEPROM or Flash memory) for storing data that needs to be retained even when power is removed, and volatile memory (e.g., RAM) for temporary data storage during operation.

The signal processing unit 305 can be employed to manage data processing, and handle communication with external devices or systems. The signal processing unit 305 may include firmware that determines the functionality and behavior of the signal processing unit 305.

FIGS. 4A to 4J each illustrate screen shots of a software application 400 employable by the system 100 of FIG. 1 for interfacing with the cinematography battery pack(s) 101.

Referring to FIGS. 4A to 4J, the proximity tag read/write device 105 (e.g., the control module 106 of the proximity tag read/write device 105) may store, run, or otherwise interface with a software application, such as a web or cloud-based software application 400. Software application 400 may be employed to execute the various features and methods described herein.

The software application 400 enhances the NFC/RFID functionality of the cinematography battery pack(s) 101 by providing comprehensive control and management features, along with a battery-vital storage database.

The software application 400 provides the capability to batch-process instructions for altering battery settings, such as assigning asset tags, streamlining the management process by allowing users to apply changes across multiple battery packs simultaneously with a single tap to each pack's NFC, eliminating the need to repeat the asset tag process for each individual pack.

The application 400 may provide secure access to battery data and settings. For example, there may be three different levels of access to the NFC on the battery packs.

First, at user level, individuals can easily view battery vitals using any NFC reader, gaining insights into essential parameters such as charge capacity and manufacturing date.

Second, at an administrative level, users enjoy enhanced privileges, including the ability to view battery vitals, assign asset tags, and password protect tags for enhanced security. Additionally, administrators can customize the color of the power gauge LEDs for easy identification and organize battery data effectively. Administrators can also access firmware revision information and key performance data to monitor battery health and performance over time. Furthermore, admins have the option to hide certain data from standard users, ensuring confidentiality and privacy where needed.

Third, super administrators, such as manufacturers or service shops, may possess ultimate authority over battery pack management. They can override admin-assigned asset tags, access diagnostic-level data for in-depth analysis, and address any service issues promptly and effectively.

Figure 5:
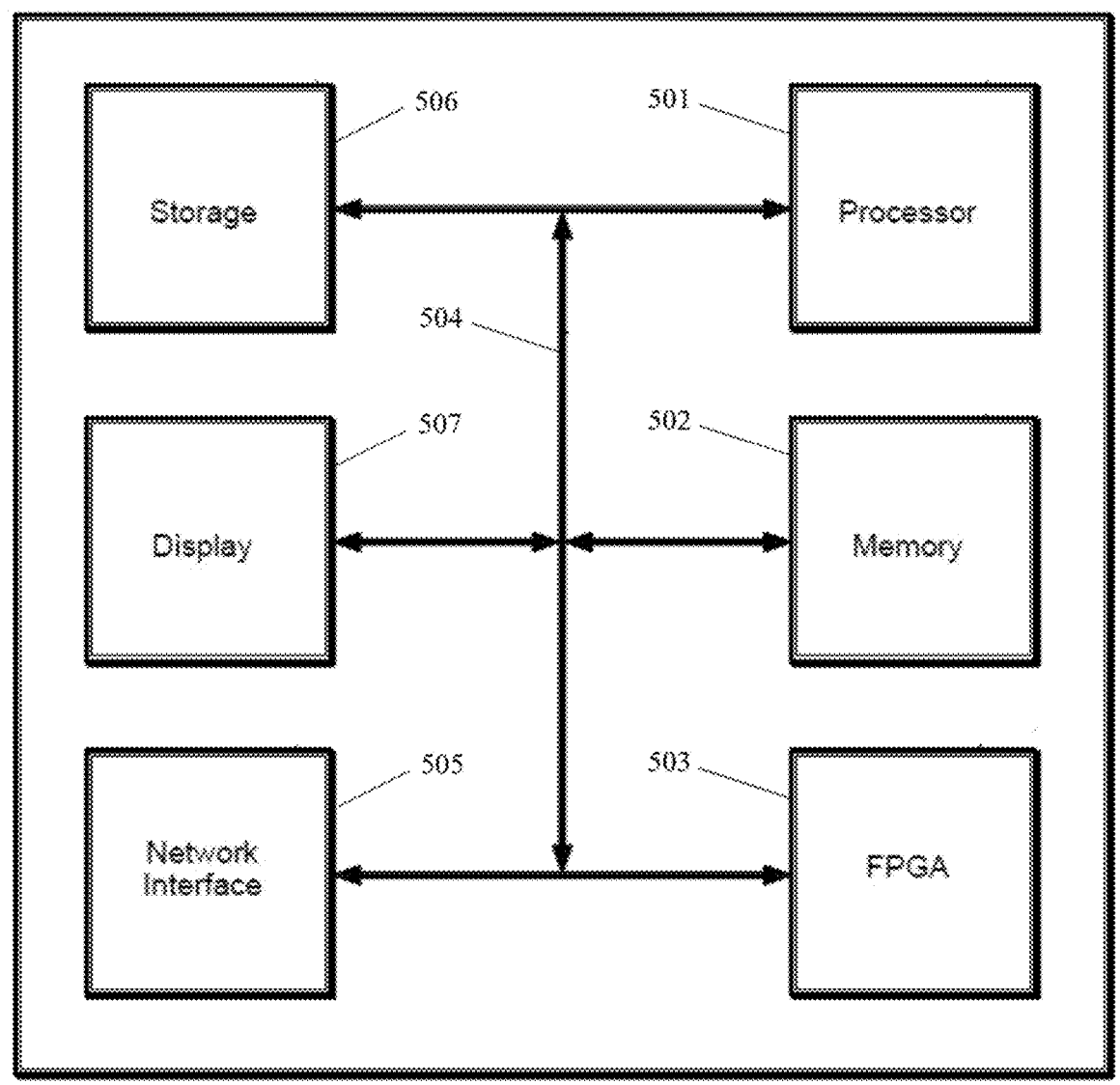
FIG. 5 is schematic diagram of an exemplary general purpose computer employable by the system of FIG. 1.

Referring particularly to FIG. 5, a general-purpose computer 500 is described. The devices described herein (e.g., the proximity tag read/write device 105 of FIG. 1) may have the same or substantially the same structure as the computer 500 or may incorporate at least some of the components of the computer 500. The general-purpose computer 500 can be employed to perform the various methods and algorithms described herein. The computer 500 may include a processor 501 connected to a computer-readable storage medium or a memory 502 which may be a volatile type memory, e.g., RAM, or a non-volatile type memory, e.g., flash media, disk media, etc. The processor 501 may be another type of processor such as, without limitation, a digital signal processor, a microprocessor, an ASIC, a graphics processing unit (GPU), field-programmable gate array (FPGA) 503, or a central processing unit (CPU).

In some aspects of the disclosure, the memory 502 can be random access memory, read-only memory, magnetic disk memory, solid state memory, optical disc memory, and/or another type of memory. The memory 502 can communicate with the processor 501 through communication buses 504 of a circuit board and/or through communication cables such as serial ATA cables or other types of cables. The memory 502 includes computer-readable instructions that are executable by the processor 501 to operate the computer 500 to execute the algorithms described herein. The computer 500 may include a network interface 505 to communicate (e.g., through a wired or wireless connection) with other computers or a server. A storage device 506 may be used for storing data. The computer may include one or more FPGAs 503.

The FPGA 503 may be used for executing various machine learning algorithms. A display 507 may be employed to display data processed by the computer 500.

Generally, the memory 502 may store computer instructions executable by the processor 501 to carry out the various functions described herein.

The computer 500 may employ various artificial intelligence models, such as one or more machine learning models or algorithms.

Unless otherwise indicated below, the proximity tag read/write device 605 is substantially the same as the proximity tag read/write device 105 described herein, and thus duplicative descriptions may be omitted below. Additionally, the cinematography battery packs 601 are substantially the same as the cinematography battery packs 101 described herein, and thus duplicative descriptions may be omitted below.

FIG. 6 is a schematic diagram of an assembly 600 for interfacing with multiple battery packs 601 as they pass by a proximity tag read/write device 605 configured for bulk interfacing with numerous battery packs according to aspects of the present disclosure.

The proximity tag read/write device 605 may be supported on structural frame 620 configured to arrange the proximity tag read/write device 605 close enough to multiple battery packs passing by proximity tag read/write device 605 that the multiple battery packs can each undergo the read/write functions described herein substantially simultaneously.

An exemplary switching circuit for cinematography battery packs (e.g., battery pack 101) is described in U.S. Pat. No. 10,630,095, the entire contents of which are incorporated by reference herein. The switching circuit may be employed to switch the output voltage provided by cinematography battery pack 101.

Dual voltage battery packs are described in U.S. Pat. No. 11,735,841, the entire contents of which are incorporated by reference herein, and U.S. Pat. No. 11,770,012, the entire contents of which are incorporated by reference herein.

The battery mount plates described herein may be in the form of various battery mount arrangements, such as V-mount, G-mount, B-mount, or other arrangements configured to connect with a corresponding cinematography battery pack (e.g., cinematography battery pack 301) vie an electromechanical connection. Mount plates having different mounting arrangements for connecting with different types of batteries is described in U.S. Pat. No. 10,197,630, the entire contents of which are incorporated by reference herein. A mount plate having various features is described in U.S. Pat. No. 10,841,492, the entire contents of which are incorporated by reference herein.

It will be understood that various modifications may be made to the aspects and features disclosed herein. Therefore, the above description should not be construed as limiting, but merely as exemplifications of various aspects and features. Those skilled in the art will envision other modifications within the scope and spirit of the claims appended thereto.

What is claimed is:

1. A system for interfacing with a battery pack, comprising:
    at least one cinematography battery pack including a proximity tag module, wherein the proximity tag module is configured to control at least one function of the at least one cinematography battery pack, wherein the at least one cinematography battery pack includes:
        a near field communication/radio frequency identification (NFC/RFID) chip, wherein the NFC/RFID chip is configured to transmit data for the at least one cinematography battery pack, and wherein the NFC/RFID chip is configured to receive instructions to control the at least one function of the cinematography battery pack; and
        a microcontroller (MCU) in communication with the NFC/RFID chip, wherein the MCU is configured to provide the data for the at least one cinematography battery pack to the NFC/RFID chip, and wherein the MCU is configured to receive the instructions to control the at least one function of the at least one cinematography battery pack from the NFC/RFID chip; and
    a proximity tag read/write device including a control module, wherein the control module is configured to receive the data for the at least one cinematography battery pack from the NFC/RFID chip, and wherein the control module is configured to transmit the instructions to the NFC/RFID chip to control the at least one function of the at least one cinematography battery pack, wherein the control module of the proximity tag read/write device includes:
    a processor; and
    a memory in communication with the processor, wherein the memory stores computer instructions configured to instruct the processor to cause the control module to compile a list of managed cinematography battery packs, wherein the compiled list of managed cinematography battery packs includes the at least one cinematography battery pack, wherein the computer instructions are configured to instruct the processor to add an additional cinematography battery pack to the compiled list of managed cinematography battery packs.

2. The system of claim 1,
    wherein the memory stores computer instructions configured to instruct the processor to cause the control module to transmit the instructions to the NFC/RFID chip to control the at least one function of the at least one cinematography battery pack.

3. The system of claim 2, further including a system management bus (SMBus) library configured to provide a communication protocol between the MCU and the NFC/RFID chip, wherein the SMBus library includes a plurality of communication fields.

4. The system of claim 3, wherein the MCU is configured to select at least one communication field of the plurality of communication fields from the SMBus library to provide the data for the at least one cinematography battery pack to the NFC/RFID chip.

5. The system of claim 1, wherein the proximity tag read/write device is a smartphone, tablet computer, laptop computer, a near field communication scanner, or a special purpose near field communication read/write device.

6. The system of claim 1, wherein the data for the at least one cinematography battery pack includes at least one of a battery name, a cycle count, a manufacturing date, a voltage, a design capacity, a current charge capacity, a firmware revision, an asset tag, a serial number, a current, a current percentage charge, a battery chemistry, a battery production deal, or a battery health.

7. The system of claim 1, wherein the control module is configured to transmit the instructions to the NFC/RFID chip to control at least one of asset tag information, an entered date of first use, or a display color of at least one light of the at least one cinematography battery pack.

8. The system of claim 1,
wherein the memory stores computer instructions configured to instruct the processor to cause the control module to detect an asset tag of the at least one cinematography battery pack or to assign a new asset tag to the at least one cinematography battery pack.

9. The system of claim 1, wherein the computer instructions are further configured to instruct the processor to remove at least one cinematography battery pack from the compiled list of managed cinematography battery packs.

10. The system of claim 1,
wherein the memory stores computer instructions configured to instruct the processor to cause the control module to select at least one color for a light emitting diode display of the at least one cinematography battery pack.

11. A cinematography battery pack, comprising:
a proximity tag module, wherein the proximity tag module is configured to control at least one function of the cinematography battery pack, wherein the cinematography battery pack includes:
a near field communication/radio frequency identification (NFC/RFID) chip, wherein the NFC/RFID chip is configured to transmit data for the cinematography battery pack, and wherein the NFC/RFID chip is configured to receive instructions to control the at least one function of the cinematography battery pack; and
a microcontroller (MCU) in communication with the NFC/RFID chip, wherein the MCU is configured to provide the data for the cinematography battery pack to the NFC/RFID chip, and wherein the MCU is configured to receive the instructions to control the at least one function of the cinematography battery pack from the NFC/RFID chip,
wherein the NFC/RFID chip is configured to receive write instructions from a proximity tag read/write device including a control module configured to transmit the instructions to the NFC/RFID chip to control the at least one function of the cinematography battery pack; and
a system management bus (SMBus) library configured to provide a communication protocol between the MCU and the NFC/RFID chip, wherein the SMBus library includes a plurality of communication fields,
wherein the MCU is configured to select at least one communication field of the plurality of communication fields from the SMBus library to provide the data for the cinematography battery pack to the NFC/RFID chip.

12. The cinematography battery pack of claim 11, wherein the proximity tag read/write device is a smartphone, tablet computer, laptop computer, a near field communication scanner, or a special purpose near field communication read/write device.

13. The cinematography battery pack of claim 11, wherein the data for the cinematography battery pack includes at least one of a battery name, a cycle count, a manufacturing date, a voltage, a design capacity, a current charge capacity, a firmware revision, an asset tag, a serial number, a current, a current percentage charge, a battery chemistry, a battery production deal, or a battery health.

14. The cinematography battery pack of claim 11, wherein the NFC/RFID chip is configured to receive or transmit an asset tag for the cinematography battery pack.

15. A system for interfacing with a battery pack, comprising:
at least one cinematography battery pack including a proximity tag module, wherein the proximity tag module is configured to control at least one function of the at least one cinematography battery pack, wherein the at least one cinematography battery pack includes:
a near field communication/radio frequency identification (NFC/RFID) chip, wherein the NFC/RFID chip is configured to transmit data for the at least one cinematography battery pack, and wherein the NFC/RFID chip is configured to receive instructions to control the at least one function of the cinematography battery pack; and
a microcontroller (MCU) in communication with the NFC/RFID chip, wherein the MCU is configured to provide the data for the at least one cinematography battery pack to the NFC/RFID chip, and wherein the MCU is configured to receive the instructions to control the at least one function of the at least one cinematography battery pack from the NFC/RFID chip; and
a proximity tag read/write device including a control module, wherein the control module is configured to receive the data for the at least one cinematography battery pack from the NFC/RFID chip, and wherein the control module is configured to transmit the instructions to the NFC/RFID chip to control the at least one function of the at least one cinematography battery pack, wherein the control module is configured to compile a list of managed cinematography battery packs, wherein the compiled list of managed cinematography battery packs includes the at least one cinematography battery pack, wherein the control module is configured to add an additional cinematography battery pack to the compiled list of managed cinematography battery packs.

16. The system of claim 15, further including a system management bus (SMBus) library configured to provide a communication protocol between the MCU and the NFC/RFID chip, wherein the SMBus library includes a plurality of communication fields.

17. The system of claim 16, wherein the MCU is configured to select at least one communication field of the plurality of communication fields from the SMBus library to provide the data for the at least one cinematography battery pack to the NFC/RFID chip.

18. The system of claim 15, wherein the proximity tag read/write device is a smartphone, tablet computer, laptop computer, a near field communication scanner, or a special purpose near field communication read/write device.

19. The system of claim 15, wherein the control module is configured to transmit the instructions to the NFC/RFID chip to control at least one of asset tag information, an entered date of first use, or a display color of at least one light of the at least one cinematography battery pack.

20. The system of claim 15, wherein the control module is configured to detect an asset tag of the at least one cinematography battery pack or to assign a new asset tag to the at least one cinematography battery pack.

\* \* \* \* \*